United States Patent [19]

Yamamura et al.

[11] 4,427,991
[45] Jan. 24, 1984

[54] HIGH FREQUENCY SEMICONDUCTOR DEVICE

[75] Inventors: Shigeyuki Yamamura; Kinjiro Kosemura; Takao Shima; Norio Hidaka, all of Kawasaki, Japan

[73] Assignee: Fujitsu Limited, Kawasaki, Japan

[21] Appl. No.: 206,543

[22] PCT Filed: Dec. 22, 1979

[86] PCT No.: PCT/JP79/00323

§ 371 Date: Aug. 26, 1980

§ 102(e) Date: Aug. 20, 1980

[87] PCT Pub. No.: WO80/01437

PCT Pub. Date: Jul. 10, 1980

[30] Foreign Application Priority Data

Dec. 28, 1978 [JP] Japan .................. 53-164786

[51] Int. Cl.³ .......................................... H01L 23/02
[52] U.S. Cl. ........................... 357/74; 357/51; 330/307; 330/286; 330/277; 333/247
[58] Field of Search .............. 330/307, 286, 277; 357/74, 51; 333/247

[56] References Cited

U.S. PATENT DOCUMENTS 3,940,706 2/1976 Stegens ..................... 330/286
3,958,195 5/1976 Johnson .................... 333/247
4,259,684 3/1981 Dean ........................ 333/247

Primary Examiner—Martin H. Edlow
Attorney, Agent, or Firm—Staas & Halsey

[57] ABSTRACT

A high frequency, hermetically-sealed, semiconductor device with the capability of being cascade-connected with corresponding devices in an advantageous manner. The device consists of a function element which includes at least one semiconductor and other circuit elements necessary for forming a functional amplifier, a DC power circuit for operating the device and high frequency circuits for connecting to corresponding high frequency devices. This device also consists of a metal base substrate, which is used for anchoring the device and mounting other parts of the device thereon, an insulating substrate having a plurality of independent metallized layers used as external contacts and a sealing part for hermetically sealing that part of the insulating substrate which mounts and encloses the function element. The overall shape and structure of the device is such so as to minimize the size of the hermetic seal required to seal any semiconductors in the function element while also minimizing the total size of the device. The device is constructed with external contacts to facilitate alignment in close proximity with corresponding devices for the purpose of forming a cascade amplifier.

20 Claims, 14 Drawing Figures

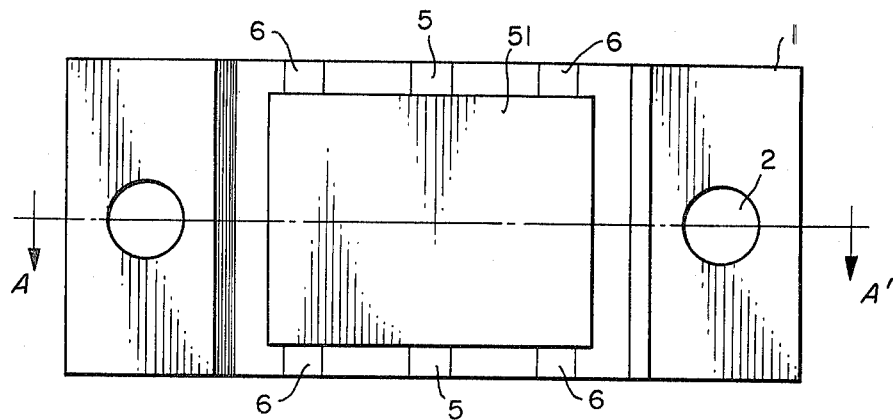
FIG. 5A.
FIG. 5B.
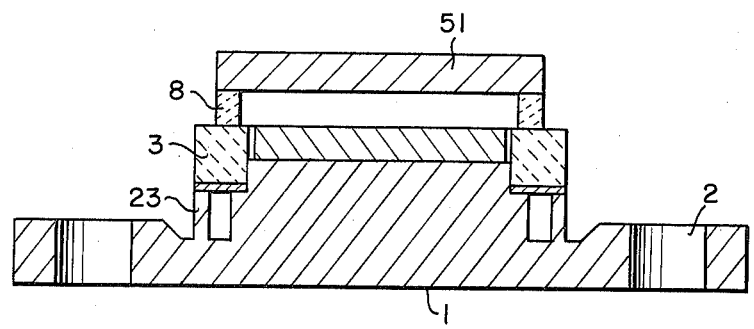
FIG. 7.
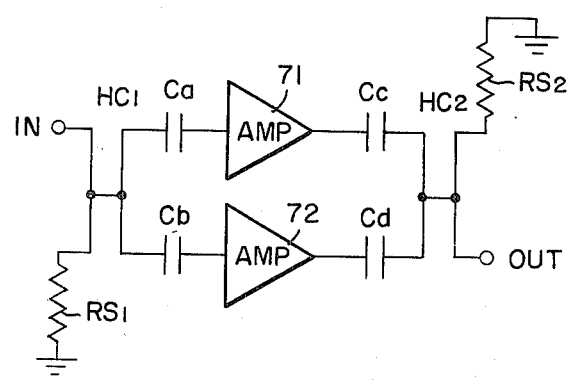
FIG. 8.
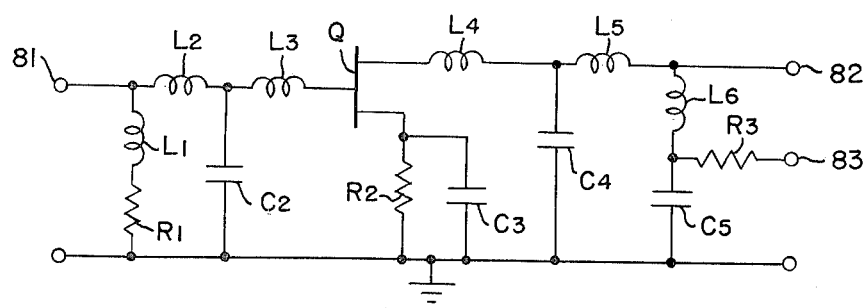

HIGH FREQUENCY SEMICONDUCTOR DEVICE

TECHNICAL FIELD

This invention relates to a high frequency semiconductor device, and more particularly, to a structure of the high frequency semiconductor device which provides a circuit substrate for mounting active elements such as transistors, passive elements such as capacitors and resistors and a package for accommodating the circuit substrate, and handles a high frequency signal such as a microwave signal.

BACKGROUND ART

A high frequency semiconductor device, such as a microwave amplifier, provides a circuit substrate for mounting active elements such as transistors, passive elements such as capacitors, resistors and inductors, and a package for accommodating them.

Within the existing art, in order to form a high frequency semiconductor device such as a single-stage microwave amplifier, a transistor, which is hermetically sealed to prevent degradation of its characteristics and which is provided with leads to connect to other circuit elements, is mounted on a circuit substrate. The transistor is connected with the other elements which are also mounted on the same circuit substrate and are required for the formation of an amplifier. The circuit substrate is housed in a metal case.

Some of the various elements fixed on the substrate and forming the amplifier, such as transistors, are individually, hermetically sealed and as a result occupy a great deal of space. Thus, a large circuit substrate and an appropriately large case are required in order to mount such an amplifier.

In a situation involving a multi-stage amplifier the size of the total device is quite large because the device consists of a plurality of large, interconnected circuit substrates mounting hermetically sealed containers.

In the existing method for coping with this disadvantage transistor chips are mounted together with the other necessary circuit elements on the substrate formed on the metal base. The transistor chips are not individually hermetically sealed. Rather, all the circuit mounting substrates are accommodated in one metal case which is hermetically sealed. Such a structure has the advantage that physical dimensions are reduced as compared with the existing multi-case structure. However, at the same time it has the disadvantage that perfect sealing becomes difficult because the size of the seal is substantially greater for the entire metal case than for the structures in which individual transistors are hermetically sealed.

SUMMARY OF THE INVENTION

An object of the present invention lies in offering a high frequency semiconductor device which is compactly designed as an entire unit, even for a multi-stage arrangement, and has sufficient hermetical sealing.

Another object of the present invention lies in offering a high frequency semiconductor device which comprises a plurality of high frequency semiconductor amplifiers, directly cascade-connected, without intervention of any elements, so as to form a multi-stage amplifier circuit.

The present invention offers a high frequency semiconductor device which is small in size and has sufficient sealing. The device can easily be used for assembling a system by providing:

(1) a metal base substrate on which are mounted a function device having at least one semiconductor element, a DC circuit for operating said semiconductor element and a high frequency circuit which is used for cascade-connecting the semiconductor element with an external circuit, and which is also used as the ground electrode for a high frequency component; (2) an insulating substrate which surrounds the function device in the form of a frame and simultaneously provides a plurality of independent metallized parts for connection with the external circuits at its surface; and (3) a sealing part for hermetically sealing the function device.

BRIEF DESCRIPTION OF THE DRAWINGS

FIG. 2 shows a metal base substrate 1. FIG. 2A is a plan view, while

FIG. 3 shows a structure in which an insulating substrate 3 is mounted on the metal base substrate 1. FIG. 3A is a plan view, while

FIG. 4 shows a structure in which an insulating frame 8 is mounted on the insulating substrate 3 and a circuit substrate 4 is disposed on a support 21 of the metal base substrate. FIG. 4A is a plan view, while

FIG. 5 shows a structure in which a cover 51 is mounted on the insulating frame 8. FIG. 5A is a plan view, while FIG. 5B is a cross-section along the line A—A' of FIG. 5A.

FIG. 7 is a functional block diagram of the circuit shown in FIG. 6.

FIG. 8 is an equivalent circuit diagram of the amplifier shown in FIG. 7.

DESCRIPTION OF THE PREFERRED EMBODIMENTS

Preferred embodiments of the present invention are explained by reference to the attached drawings.

Figure 1:
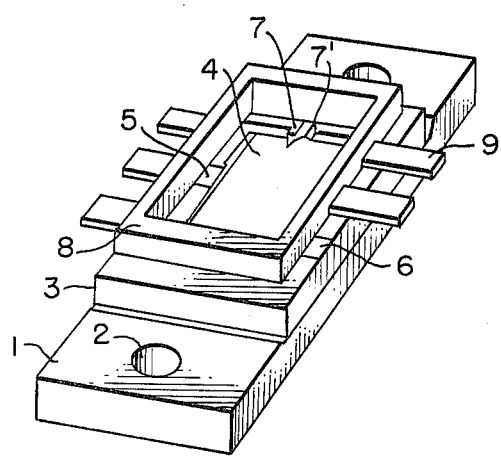
FIG. 1 is a perspective view of the uncovered outline of a high frequency semiconductor device of the present invention.

FIG. 1 shows a perspective view outline of a high frequency semiconductor device embodying the present invention, without its cover for hermetical sealing. Preferably, this high frequency semiconductor device is a microwave amplifier. The insulating substrate 3 consists of insulating material, such as ceramic, and is fixed on the metal base substrate 1 which is composed of a non-acidic copper element and which has mounting screw holes 2. This insulating substrate 3 is provided with a depression at its center, and herein is positioned the circuit substrate 4 on which various elements, such as transistors and the matching circuit capacitors, inductors and directional couplers, are mounted to form microwave amplifier circuits. The metallized or metallic layers 5, 6, 7, 7', are connections between a microwave amplifier formed on the circuit substrate 4 and external circuits, and are formed on the insulating substrate 3. The metallized layer 5 can be the connection for the high frequency signal input of a microwave amplifier circuit. Layer 5 extends to the outer end of the insulating substrate 3 from the depression of insulating substrate 3 as does metallized layer 6. At the areas of the insulating substrate 3 facing each other and sandwiching the circuit substrate 4, a metallized layer for a high frequency signal output can be formed.

The metallized layer 6 can be used for supplying DC voltage, and its end has the same shape as the metallized layers 7 or 7'.

Figure 4A:
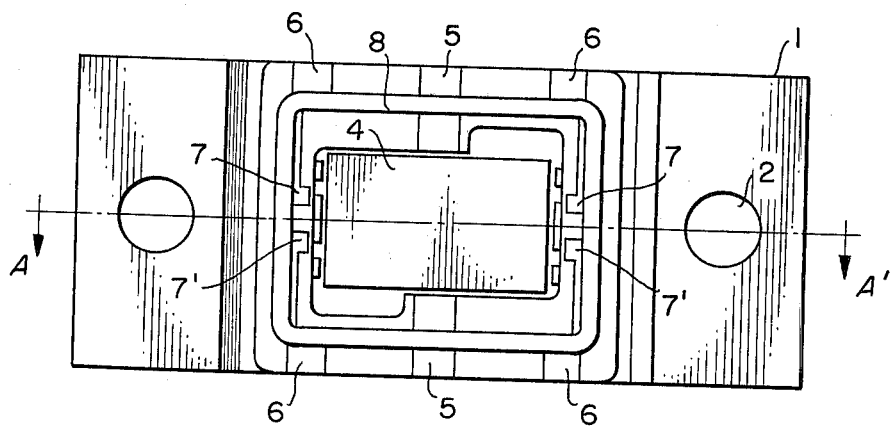

For high frequency signals two metallized layers 6 are formed on each side of metallized layer 5 of the high frequency semiconductor device as shown in FIG. 4A.

The ends of the metallized layers 7, 7' are disposed face to face to each other. One electrode is connected to the other electrode at one terminal of a resistor respectively via a wire and a resistor. These metallized layers are formed by a process of tungsten paste being coated by the screen printing method and baked, after which nickel plating or gold plating is applied. On the insulating substrate 3, the insulating frame 8 which consists of ceramic material is constructed across these metallized layers. Also, a cover (not illustrated) for sealing can be placed over insulating frame 8 and the sealing part formed thereupon.

On each metallized layer outside the insulating frame 8, a lead 9 may be provided as indicated in FIG. 1 according to a method of using a high frequency semiconductor device. FIG. 1 shows a structure in which a lead is not shown at one of the points of metallized layer 6 simply for ease of illustration.

Each part of the aforementioned high frequency semiconductor device embodying the present invention is now explained in more detail.

Figure 2A:
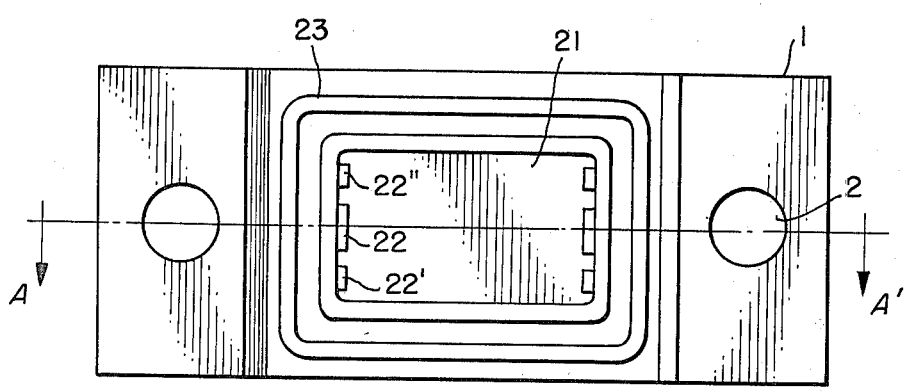
Figure 2B:
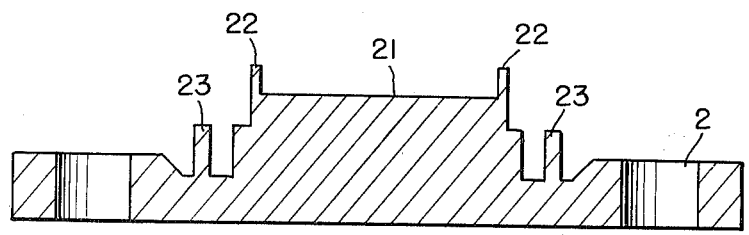
FIG. 2B is a cross-section along the line A—A' of FIG. 2A.

FIG. 2 shows the metal base substrate 1. FIG. 2A is a plan view, while FIG. 2B is a cross-section along the line A—A' of FIG. 2A. The metal base substrate 1 is provided with the base 21, on which the circuit substrate is mounted, and the projections 22, 22', 22" for grounding general parts of the circuit mounted on the circuit substrate. At the circumference of the base 21, support 23 for holding the insulating substrate is provided.

Figure 3A:
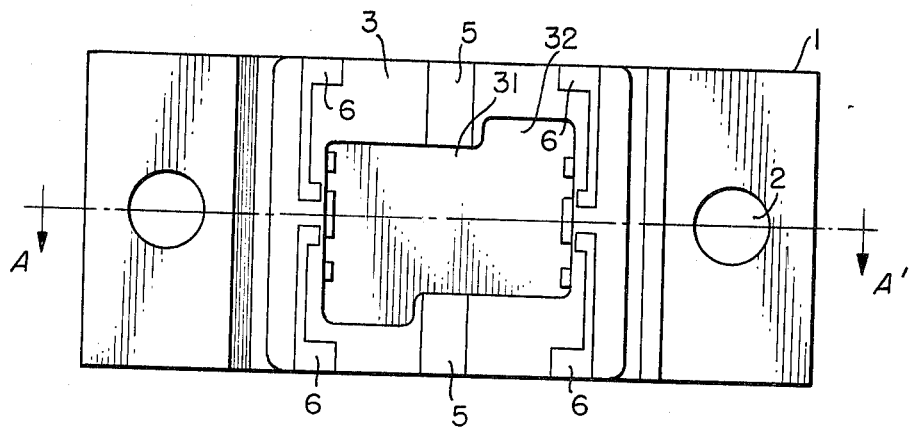
Figure 3B:
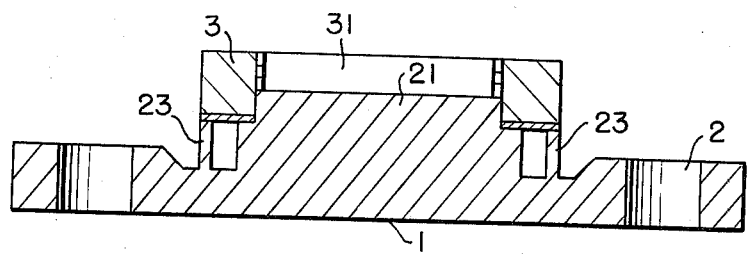
FIG. 3B is a cross-section along the line A—A' of FIG. 3A.

FIG. 3 shows the condition where the insulating substrate 3 is mounted on the metal base substrate 1. FIG. 3A is a plan view, while FIG. 3B is a cross-section along the line A—A' of FIG. 3A. The insulating substrate 3 is supported by the periphery of base 21 and the support 23. The metal base substrate 1 and insulating substrate 3 are bonded together with silver solder. The insulating substrate 3 is provided with a depression 31 for accommodating the circuit substrate. The depression 31 is provided with a dent groove 32 so that plating solution used in forming the metallized layers or substrate does not remain in the gap between the base 21 and support 23, but flows out therefrom when the plating process is performed on the metal base substrate 1 for mounting the insulating substrate 3. At the surface of insulating substrate 3, the metallized layer 5 used for high frequency signal connections and the metallized layer 6 used for supplying a DC bias to the microwave amplifier are formed.

Figure 4B:
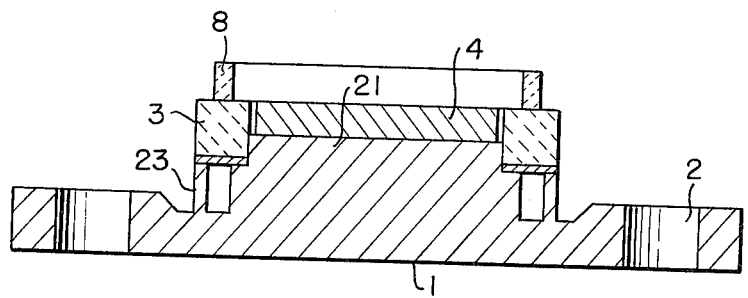
FIG. 4B is a cross-section along the line A—A' of FIG. 4A.

FIG. 4 shows the insulating frame 8 mounted on the insulating substrate 3 and the circuit substrate 4 mounted on the metal base substrate 21. FIG. 4A is a plan view, while FIG. 4B is a cross-section along the line A—A' of FIG. 4A. The insulating substrate 3 and insulating frame 8 are bonded together with alumina.

The metallized or metallic layer 5 is connected with the input and output ends of a directional coupler (not illustrated) via a connecting means located inside the insulating frame 8. The metallized layer 6 is connected to an element formed on the circuit substrate 4 via a connecting means located at the ends 7 and 7' inside of the insulating frame 8. In FIG. 4, various elements formed on the circuit substrate 4 are not illustrated. These are explained in detail later in the specification.

FIG. 5 shows a structure in which a cover 51 is mounted on the insulating frame 8. FIG. 5A is a plan view, while FIG. 5B is a cross-section along the line A—A' of FIG. 5A.

The cover 51 is made of an insulator, such as ceramic, or a metal element, such as KOVAR (trademark), and is bonded to the insulating frame 8 with an alloy AuSn (20) of gold (Au) and tin (Sn).

The insulating frame 8 and cover 51 form the sealing means of a high frequency semiconductor device embodying the present invention. A metal such as KOVAR (trademark) can be used as a sealing part, to integrate the insulating frame and cover. However, in this case, to prevent a short-circuit between metallized layers an insulator is provided at the contact area of metallized layers 5 and 6. Moreover, coupling between these two metallized layers can be prevented by providing a metallized layer, which reaches the metal base substrate, and is located between the metallized layers used for high frequency signal connections and those used for DC signal connections. The above explanation is given essentially for a situation involving the circuit substrate of a high frequency semiconductor device of the present invention.

Figure 6:
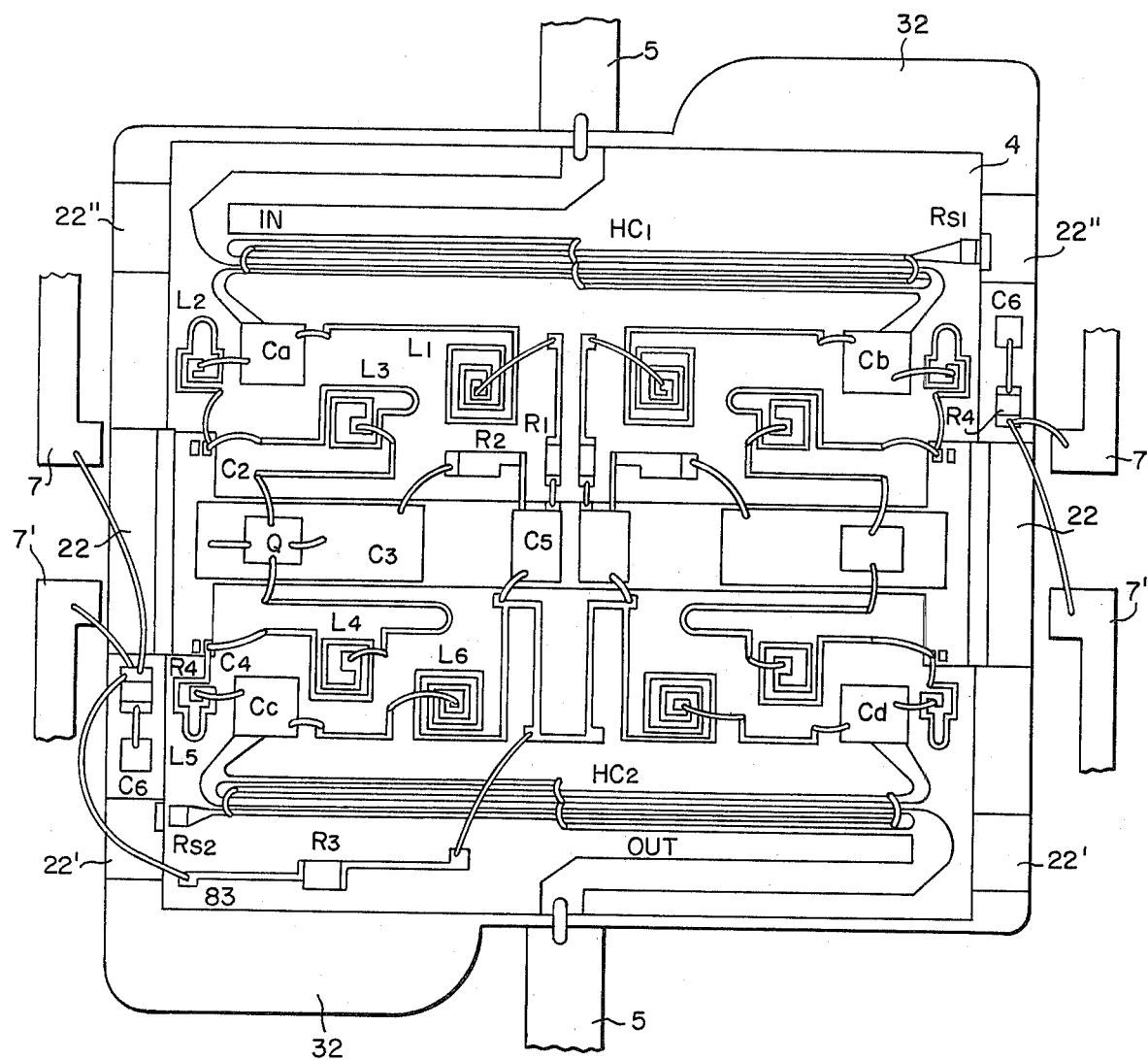
FIG. 6 shows a high frequency semiconductor device of the present invention, particularly an amplifier circuit of a microwave signal amplifier.

FIG. 6 shows a high frequency semiconductor device embodying the present invention, particularly a microwave amplification circuit. The amplifier circuit formed on the circuit substrate 4 is a balance type amplifier circuit, showing nearly symmetrical characteristics on the right and left sides. As shown in FIG. 7, a microwave signal being received by the input terminal labeled IN of the directional (hybrid) coupler HC 1 is divided into a pair of signal components and these divided signals are respectively amplified by the amplifiers 71 and 72, and then combined by the hybrid coupler HC 2. Thus, an amplified microwave signal is transmitted from the output terminal labeled OUT.

In FIG. 7 one end of each of the hybrid couplers HC 1 and HC 2 is respectively terminated by the resistors $R_{s1}$ and $R_{s2}$. Ca, Cb, Cc and Cd denote DC block capacitors. The amplifiers 71 and 72 have similar structures.

An example of an equivalent circuit of the amplifier 71 is shown in FIG. 8. In this figure, 81 is the input end of amplifier 71 and the input matching circuit is composed of inductors $L_2$, $L_3$ and capacitor $C_2$. The output matching circuit is formed by inductors $L_4$, $L_5$ and the capacitor $C_4$. The gate self-bias circuit is formed by inductor $L_1$, resistors $R_1$ and $R_2$, the capacitor $C_3$. The drain bias circuit is formed by inductor $L_6$, resistor $R_3$ and capacitor $C_5$. 82 denotes the output end, while 83 denotes the DC bias input end.

A structure of an amplifier circuit indicated by the above equivalent circuit is shown in FIG. 6 and corresponding symbols or labels are used as in FIGS. 7 and 8. FIG. 6 shows an enlarged view of the circuit substrate 4 on which an amplifier circuit is formed and the area near to the depression of the insulating substrate 3.

As is obvious from FIG. 6, the input end IN of the hybrid coupler HC 1 and the output end OUT of the hybrid coupler HC 2 are respectively connected with metallized layer 5, which is formed on the insulating substrate to handle high frequency signals, and an electrode of one of the grounded elements, such as termination resistors $R_{s1}$, $R_{s2}$ and capacitors $C_2$, $C_4$. These are connected to the projections 22, 22', and 22" of the metal base substrate. The edges of metallized layers 7 and 7' used for DC power supply are connected to resistor $R_4$ by wire. Resistor $R_4$ is connected to the upper electrode of a capacitor $C_6$. The capacitor's lower electrode is connected to the metal base substrate for grounding as shown on both sides of FIG. 6. On the left hand side of FIG. 6 a wire is bridged between resistor $R_4$ and the input end 83 of the bias circuit so that a bias voltage is supplied from an external circuit to the resistor $R_3$ thus forming a bias circuit. It is also possible to directly connect the metallized layers 7 and 7' by wire in order to supply the externally supplied bias voltage to metallized layer 7' from layer 7, but resonance sometimes occurs between the facing metallized layers 7 and 7'. Therefore, grounding is made through the resistor $R_4$ and capacitor $C_6$ in order to prevent such resonance. Some of the various elements of these circuits may be obtained as monolithic elements.

For a high frequency semiconductor device such as a microwave amplifier the importance of the present invention lies in the fact that the circuits which accompany the amplification element (such as a field effect transistor) are housed in a single case. These circuits include such functions as input/output matching circuit and directional coupler as well as other circuit elements used in the amplification function.

Thus, a high frequency semiconductor device itself can function perfectly as an amplifier without connection with any external matching circuit, etc. Therefore, in a situation where this device is used as a single stage amplifier, the amplifier can be obtained by providing leads to the metallized layers. A multi-stage amplifier can also be formed by the connection shown in FIG. 9.

Figure 9:
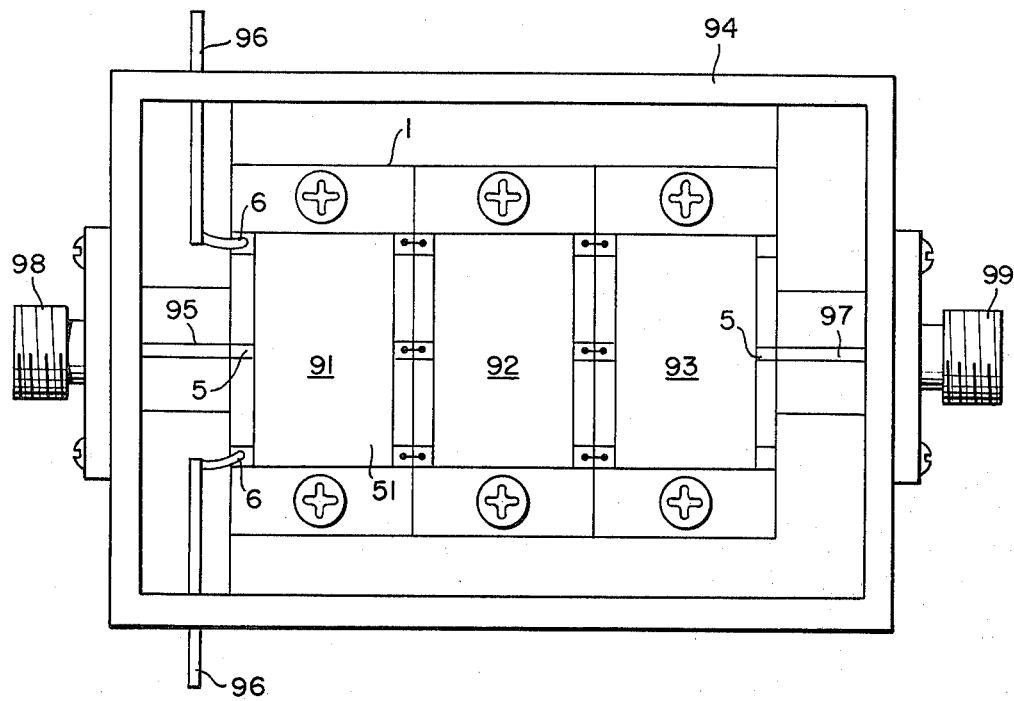
FIG. 9 shows a structure in which a microwave amplifier of three stages of the present invention is housed in a case.

FIG. 9 shows a configuration for a three stage microwave amplifier. When the microwave amplifiers 91, 92, 93 are fixed to a metal case 94 by screw-fastening in a side-by-side arrangement of each metal base substrate 1, the metallized layers for the DC connections and the high frequency connections are arranged face to face respectively. The microwave signal from the input connector 98 of the metal case is amplified by amplifiers 91, 92, 93. Then, the signal is output from the output connector 99 by connecting the above mentioned metallized layers with wire or conductive ribbon. The high frequency metallized layer 5 of the microwave amplifier 91 is connected to the strip line 95. The DC metallized layer 6 is connected to the bias terminal 96 provided in the metal case 94. The high frequency metallized layer 5 of the microwave amplifier 93 is connected to the strip line 97. A bias voltage which is required for the operation of the amplifiers supplied to amplifiers 91, 92 and 93 by connecting the bias power supply to the bias terminal 96. The metal case 94 requires a cover but the cover does not have to be hermetically sealed because each amplifier is already hermetically sealed.

As described above, a high frequency semiconductor device embodying the present invention is functionally self-contained. Therefore, when forming a system by using these devices, there is no need for external matching circuits and a system can be put together as a block diagram. For this reason, system assembly can be made very easily.

Figure 10:
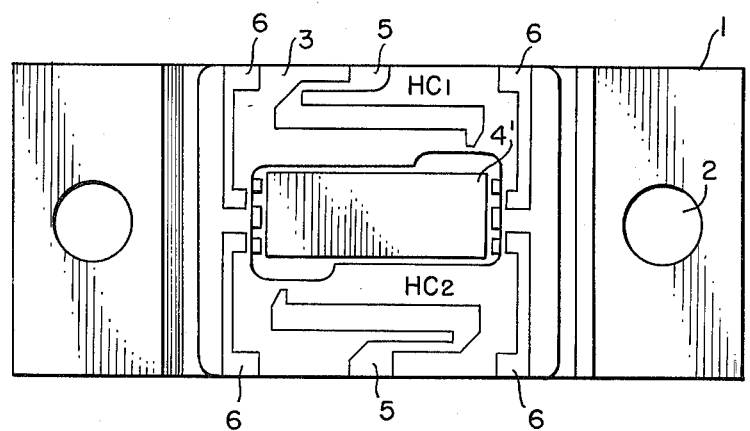
FIG. 10 is a plan view of another embodiment of the present invention.

FIG. 10 shows another embodiment of the present invention indicating a structure in which an insulating frame is not installed, as in FIG. 3. However, the circuit substrate 4' is housed in the depression of insulating substrate 3.

The hybrid couplers HC 1 and HC 2 which are mounted on the circuit substrate in the first embodiment are provided on the insulating substrate 3 in this embodiment. The hybrid coupler used in the balance type amplifier circuit of a high frequency semiconductor device cannot be reduced in size since the coupling part requires a length of ¼ of the wavelength of the signal used. Despite the other circuit elements' reduction in size, the coupling part still occupies the greater part of the circuit substrate.

Thus, disposition of hybrid couplers on the insulating substrate can realize a substantial reduction in size of the circuit substrate 4'. In case an expensive sapphire is used as the circuit substrate, a much greater number of circuit substrates can be obtained from a sheet of wafer and therefore the cost per circuit substrate can be reduced, thus realizing a low overall cost of the total device. Other elements as well as the hybrid coupler may be formed on the insulating substrate.

As explained above, the present invention is capable of offerng a high frequency semiconductor device which is small in size, provides sufficient sealing and ensures easy system assembly.

What is claimed is:

1. A high frequency semiconductor device comprising:
   (a) a metal base substrate for forming a ground electrode and for fixing said high frequency semiconductor device to an external element;
   (b) a function device mounted on said metal base substrate, comprising a plurality of first circuit elements including at least:
      (i) a first semiconductor device,
      (ii) a DC circuit to power said function device, and
      (iii) high frequency coupling circuit for functionally cascade-connecting said first semiconductor device with an external high frequency device;
   (c) a frame-shaped insulating substrate mounted on said metal base substrate for surrounding said function device and having a plurality of independent metallized or metallic parts fixed on its surface for connection with an external circuit; and
   (d) sealing means for hermetically sealing said function device.

2. A high frequency semiconductor device as claimed in claim 1, wherein said metallized parts include metallized parts for said high frequency coupling circuit and metallized parts for said DC power circuit.

3. A high frequency semiconductor device as claimed in claim 1, wherein said plurality of independent metallized parts are placed in selected areas of said insulating substrate for cascade-connecting to corresponding external high frequency semiconductor devices.

4. A high frequency semiconductor device as claimed in claim 1, wherein at least one of said circuit elements is placed on said insulating substrate.

5. A high frequency semiconductor device as claim in claim 1, wherein said function device has at least one circuit element formed monolithic.

6. The device of claim 1, wherein said insulating substrate has a depression confined to an area bounded by said plurality of independent metallized parts, and wherein said device further comprises a circuit substrate located in said depression of said insulating substrate, said circuit substrate fully containing said function device.

7. The device of claim 6, wherein said function device comprises a high frequency amplifier.

8. The device of claim 7, wherein said function device further comprises a plurality of second circuit elements, including a plurality of resistors, capacitors and inductors of predetermined characteristics, operationally connected to said first circuit elements of said function device.

9. The device of claim 8, wherein said second circuit elements further comprise a second semiconductor device of predetermined characteristics.

10. The device of claim 9, wherein said second circuit elements are mounted and fully contained on said circuit substrate.

11. The device of claim 9, wherein at least part of said function device is formed monolithic.

12. The device of claim 6, wherein said high frequency coupling circuits are contained on said circuit substrate.

13. The device of claim 1 or 7, wherein said high frequency semiconductor device is shaped so that it can be aligned and mounted in close proximity to corresponding external high frequency semiconductor devices in a cascade arrangement.

14. The device of claim 1 or 7, wherein said plurality of independent metallized parts are placed in selected areas of said insulating substrate for cascade-connection to corresponding external high frequency devices.

15. The device of claim 1 or 7, wherein said sealing means comprises a ceramic frame mounted on said insulating substrate for enclosing and sealing a surface area of said insulating substrate.

16. The device of claim 6, wherein said sealing means comprises a ceramic frame mounted on said circuit substrate for enclosing and sealing a surface area of said circuit substrate.

17. A high frequency semiconductor device, in combination with a plurality of said high frequency semiconductor devices, mounted adjacent to one another and operationally connected to form a cascade amplifier, said high frequency semiconductor device comprising:
 (a) a metal base substrate for forming a ground electrode and for fixing said high frequency semiconductor device to an external element;
 (b) a function device mounted on said metal base substrate comprising a plurality of first circuit elements including at least:
  (i) a first semiconductor device,
  (ii) a DC circuit to power said function device, and
  (iii) high frequency coupling circuit for functionally cascade-connecting said first semiconductor device with an external high frequency device;
 (c) a frame-shaped insulating substrate mounted on said metal base substrate for surrounding said function device and having a plurality of independent metallized or metallic parts fixed on its surface for connection with an external circuit; and
 (d) sealing means for hermetically sealing said function device.

18. The device of claim 17, wherein said insulating substrate has a depression confined to an area bounded by said plurality of independent metallized parts, and wherein said device further comprises a circuit substrate located in said depression of said insulating substrate, said circuit substrate fully containing said function device.

19. The device of claim 17 or 18, wherein said function device comprises a high frequency amplifier.

20. The device of claim 17 or 18, wherein said plurality of high frequency semiconductor devices is fully enclosed in an external casing structure.

* * * * *